United States Patent
Hsin et al.

(10) Patent No.: US 7,622,788 B2
(45) Date of Patent: Nov. 24, 2009

(54) GAN HETEROJUNCTION BIPOLAR TRANSISTOR WITH A P-TYPE STRAINED INGAN BASE LAYER

(75) Inventors: Yue-Ming Hsin, Tainan (TW);
Jinn-Kong Sheu, Tainan County (TW);
Kuang-Po Hsueh, Taipei (TW)

(73) Assignee: National Central University, Taoyuan (TW)

( * ) Notice: Subject to any disclaimer, the term of this patent is extended or adjusted under 35 U.S.C. 154(b) by 448 days.

(21) Appl. No.: 11/308,959

(22) Filed: May 30, 2006

(65) Prior Publication Data
US 2007/0114518 A1 May 24, 2007

(30) Foreign Application Priority Data
Nov. 22, 2005 (TW) .............. 94140913 A

(51) Int. Cl.
*H01L 29/06* (2006.01)
(52) U.S. Cl. .............. 257/565; 257/E27.046; 257/E29.171
(58) Field of Classification Search ......... 257/565–593, 257/E27.046, E29.171
See application file for complete search history.

(56) References Cited

U.S. PATENT DOCUMENTS

| | | | | |
|---|---|---|---|---|
| 5,965,931 A | * | 10/1999 | Wang et al. | 257/585 |
| 2002/0149033 A1 | | 10/2002 | Wojtowicz | 257/198 |
| 2002/0195619 A1 | | 12/2002 | Makimoto et al. | 257/197 |
| 2005/0116319 A1 | | 6/2005 | Twynam | 257/565 |
| 2005/0121696 A1 | | 6/2005 | Nakazawa et al. | 257/197 |
| 2005/0156195 A1 | | 7/2005 | Chen et al. | 257/198 |

OTHER PUBLICATIONS

"Low-resistance nonalloyed ohmic contact to p-type Gan using strained InGaN contact layer" jointly authored by Kumakura et al., Applied Physics Letters, Oct. 15, 2001, pp. 2588-2590, vol. 79, No. 16., American Institute of Physics.

"Ohmic contacts to p-type GaN mediated by polarization fields in thin InxGa1-xN capping layers" jointly authored by Gessmann et al., Applied Physics Letters, Feb. 11, 2002, pp. 986-988, vol. 80, No. 6., American Institute of Physics.

"High hole concentrations in Mg-doped InGaN grown by MOVPE" jointly authored by Kumakura et al., Journal of Crystal Growth, pp. 267-270, vol. 221, Elsevier Science 2000.

* cited by examiner

*Primary Examiner*—Davienne Monbleau
*Assistant Examiner*—Matthew Reames
(74) *Attorney, Agent, or Firm*—Jianq Chyun IP Office

(57) ABSTRACT

A gallium nitride heterojunction bipolar transistor with a p-type strained InGaN base layer is provided. The gallium nitride heterojunction bipolar transistor includes a substrate, a highly doped collector contact layer located over the substrate, a low doped collector layer located over the collector contact layer, a p-type base layer located over the collector layer, a highly doped strained InGaN base layer located over the p-type base layer, a emitter layer located over the p-type strained InGaN base layer, a highly doped emitter contact layer located over the emitter layer, and an emitter metal electrode, a base metal electrode, and a collector metal electrode respectively located on the emitter contact layer, the p-type strained InGaN base layer, and the collector contact layer.

8 Claims, 7 Drawing Sheets

GAN HETEROJUNCTION BIPOLAR TRANSISTOR WITH A P-TYPE STRAINED INGAN BASE LAYER

CROSS-REFERENCE TO RELATED APPLICATION

This application claims the priority benefit of Taiwan application serial no. 94140913, filed on Nov. 22, 2005. All disclosure of the Taiwan application is incorporated herein by reference.

BACKGROUND OF THE INVENTION

1. Field of Invention

The present invention relates to a heterojunction bipolar transistor. More particularly, the present invention relates to a GaN heterojunction bipolar transistor with a p-type strained InGaN base layer and the fabricating method thereof.

2. Description of Related Art

In the fabricating technology of gallium nitride (GaN) npn-type heterojunction bipolar transistor, the key problem lies in the high resistance p-type base metal contact, and the reason thereof will be explained below in the following cross-sectional diagrams of the fabrication flow of a heterojunction bipolar transistor.

FIGS. 1A and 1B are cross-sectional diagrams illustrating parts of the fabrication flow of a conventional GaN heterojunction bipolar transistor.

First, referring to FIG. 1A, the first step of fabricating a GaN heterojunction bipolar transistor is to form a highly doped collector contact layer 102, a low doped collector layer 104, a p-type base layer 106, an emitter layer 110, and a highly doped emitter contact layer 112 on a substrate 100 in sequence. The dopant activation concentration of the p-type base layer 106 is about $10^{17} cm^{-3}$.

Then, referring to FIG. 1B, dry etching processes are performed to the emitter layer 110 and the emitter contact layer 112 until a portion of the p-type base layer 106 is exposed, so as to form an emitter layer 110a and an emitter contact layer 112a. It is remarkable that the damages to the surface of the p-type base layer 106 during the dry etching process further aggravates the base contact resistance because the dopant activation concentration of the p-type base layer 106 is not very high (about $10^{17} cm^{-3}$). Accordingly, it is more difficult to form the base ohmic contact, and further degrade the device characteristics.

There are two common solutions to the problem described above. The first solution is to optimize the conditions of the dry etching process. Even this method can reduce the surface related damages of the GaN layer of the p-type base layer after the etching process, however, base ohmic contact still can not be formed (this should be understood by those with ordinary skill in the art, so the details will not be described here) because of the increase of the gallium/nitrogen ratio on the surface caused, the surface roughness, contamination, and damages resulted from the dry etching. The second solution is to re-grow the GaN-based layer after the etching process. However, this method is complicated in process even though it reduces the increase of the base resistance.

In the aforementioned fabricating technologies of a conventional GaN heterojunction bipolar transistor, the device characteristics are poor because the surface of the p-type base layer is damaged during the dry etching process and the dopant activation concentration is too low.

SUMMARY OF THE INVENTION

Accordingly, the present invention is directed to provide a GaN heterojunction bipolar transistor with a p-type strained InGaN base layer, wherein the resistance of the base layer is reduced due to the high dopant concentration of the p-type strained InGaN base layer. Therefore, the resistance of the base ohmic contact is reduced effectively, and the operational characteristics of the device are improved.

According to another aspect of the present invention, a fabricating method of a GaN heterojunction bipolar transistor with a p-type strained InGaN base layer is provided, which can resolve the problems of the surface roughness of the p-type base layer resulted from damage during dry etching process and the difficulty in forming base ohmic contact caused by produced compound during dry etching process.

The present invention provides a structure of a GaN heterojunction bipolar transistor with a p-type strained InGaN base layer. The structure includes a substrate, a highly doped collector contact layer located over the substrate, a low doped collector layer located over the collector contact layer, a p-type base layer located over the collector layer, a highly doped p-type strained InGaN base layer located over the p-type base layer, an emitter layer located over the p-type strained InGaN base layer, a highly doped emitter contact layer located over the emitter layer, and an emitter metal electrode, a base metal electrode and a collector metal electrode respectively located on the emitter contact layer, the p-type strained InGaN base layer and the collector contact layer.

According to an embodiment of the present invention, in the foregoing GaN heterojunction bipolar transistor with a p-type strained InGaN base layer, the material of the p-type base layer is, e.g. GaN.

According to an embodiment of the present invention, in the foregoing GaN heterojunction bipolar transistor with a p-type strained InGaN base layer, the material of the emitter layer is, e.g. $Al_xGa_{1-x}$ ($0 \leq x \leq 1$).

According to an embodiment of the present invention, in the foregoing GaN heterojunction bipolar transistor with a p-type strained InGaN base layer, the material of the collector contact layer and the collector layer is, e.g. GaN.

According to an embodiment of the present invention, in the foregoing GaN heterojunction bipolar transistor with a p-type strained InGaN base layer, the dopant activation concentration of the p-type strained InGaN base layer is greater than the dopant activation concentration of the p-type base layer.

According to an embodiment of the present invention, in the foregoing GaN heterojunction bipolar transistor with a p-type strained InGaN base layer, the thickness of the p-type strained InGaN base layer is, e.g. between 1 nm and 55 nm.

According to an embodiment of the present invention, in the foregoing GaN heterojunction bipolar transistor with a p-type strained InGaN base layer, the indium molal fraction of the p-type strained InGaN base layer is, e.g. between 0.01 and 0.55.

According to an embodiment of the present invention, in the foregoing GaN heterojunction bipolar transistor with a p-type strained InGaN base layer, the replaceable materials system is, e.g. AlGaAs/GaAs, InGaP/GaAs, AlInAs/InGaAs/InP, InP/InGaAs, InP/GaAsSb/InP, AlInAs/GaAsSb/InP, Si/SiGe, or GaN/SiC.

According to an embodiment of the present invention, in the foregoing GaN heterojunction bipolar transistor with a p-type strained InGaN base layer, the material of the emitter metal electrode, the base metal electrode, and the collector metal electrode is, e.g. Au, Pt/Ti/Pt/Au, Ti/Al/Ti/Au, Ti/Au, Cr/Au, Pd/Au, Pt/Au, Ni/Au, Ta/Ti, Ti/Pt/Au, or Pt/Ru.

The present invention provides a fabricating method of a GaN heterojunction bipolar transistor with a p-type strained InGaN base layer. The method includes: first, providing a substrate; then, forming a collector contact layer, a low doped collector layer, a p-type base layer, a p-type strained InGaN base layer, an emitter layer and a highly doped emitter contact layer on the substrate in sequence; next, etching portions of the emitter layer and the emitter contact layer to expose the p-type strained InGaN base layer; after that, removing portions of the p-type strained InGaN base layer, the p-type base layer and the collector layer until the collector contact layer is exposed.

According to an embodiment of the present invention, the foregoing fabricating method of a GaN heterojunction bipolar transistor with a p-type strained InGaN base layer further includes, for example, forming an emitter metal electrode on the exposed emitter contact layer.

According to an embodiment of the present invention, the foregoing fabricating method of a GaN heterojunction bipolar transistor with a p-type strained InGaN base layer further includes, for example, forming a base metal electrode on the exposed p-type strained InGaN base layer.

According to an embodiment of the present invention, the foregoing fabricating method of a GaN heterojunction bipolar transistor with a p-type strained InGaN base layer further includes, for example, forming a collector metal electrode on the exposed collector contact layer.

According to an embodiment of the present invention, in the foregoing fabricating method of a GaN heterojunction bipolar transistor with a p-type strained InGaN base layer, the method of forming the collector contact layer, the collector layer, the p-type base layer, the p-type strained InGaN base layer, the emitter layer, and the emitter contact layer is, e.g. Molecular Beam Epitaxy or Metalorganic Chemical Vapor Deposition (MOCVD).

According to an embodiment of the present invention, in the foregoing fabricating method of a GaN heterojunction bipolar transistor with a p-type strained InGaN base layer, the replaceable materials system of the heterojunction bipolar transistor is, e.g. AlGaAs/GaAs, InGaP/GaAs, AlInAs/InGaAs/InP, InP/InGaAs, InP/GaAsSb/InP, AlInAs/GaAsSb/InP, Si/SiGe, or GaN/SiC.

In the base structure of the GaN heterojunction bipolar transistor with a p-type strained InGaN base layer of the present invention, a highly doped p-type strained InGaN base layer is added on the p-type base layer so that problem of resistance increase of the p-type base layer caused by direct etching on the p-type base layer can be reduced. The resistance of the p-type strained InGaN base layer is low because the dopant activation concentration thereof is above $10^{19}$ cm$^{-3}$, thus the difficulty in forming ohmic contact at the base is reduced and the device characteristics are improved. That the dopant activation concentration of the p-type strained InGaN base layer can reach above $10^{19}$ cm$^{-3}$ is because a two dimensional hole gas (2DHG) is formed between the p-type strained InGaN base layer and the p-type base layer.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
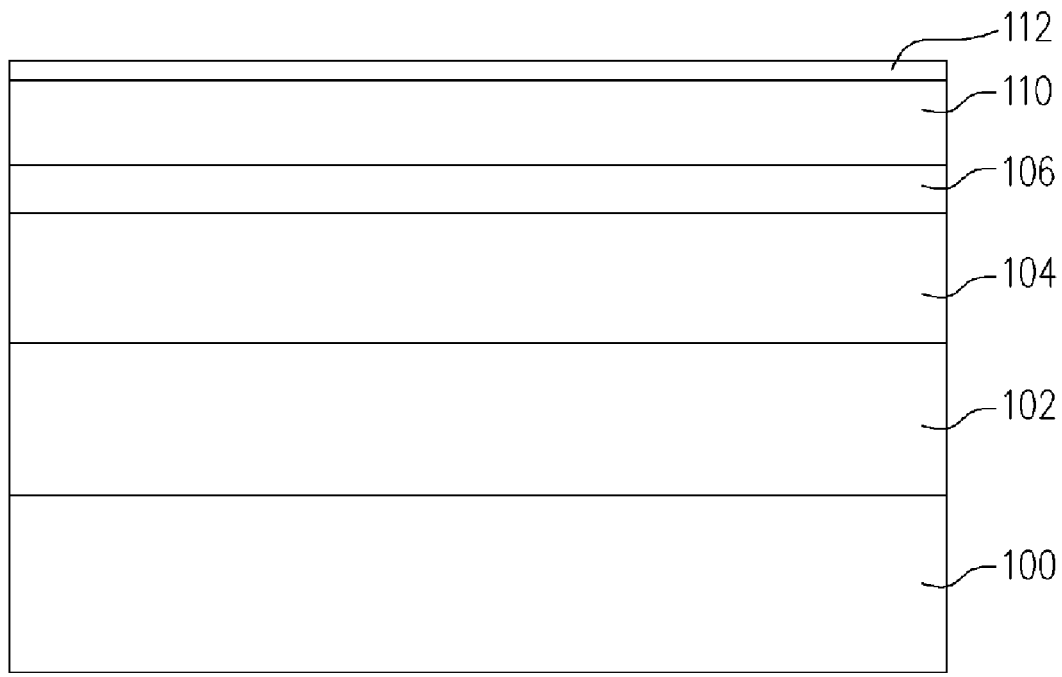
FIGS. 1A and 1B are cross-sectional diagrams illustrating parts of the fabrication flow of a conventional GaN heterojunction bipolar transistor.
Figure 1B:
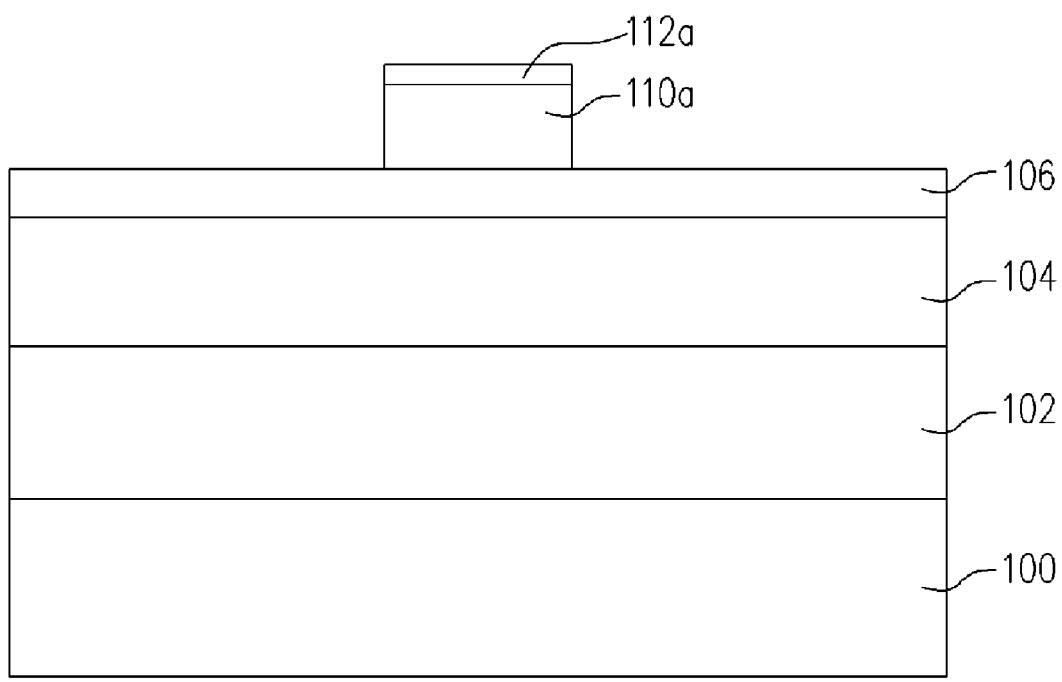
Figure 2:
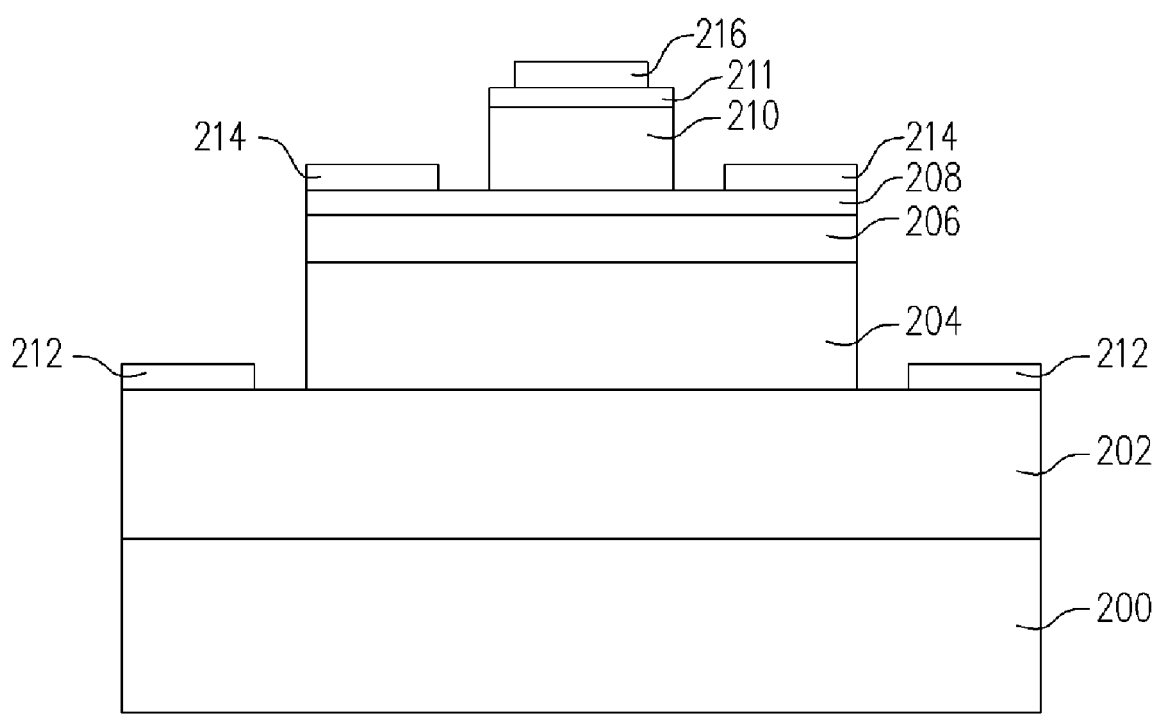
FIG. 2 is a cross-sectional diagram illustrating the structure of a GaN heterojunction bipolar transistor according to an embodiment of the present invention.

FIG. 2 is a cross-sectional diagram illustrating the structure of a GaN heterojunction bipolar transistor with a p-type strained InGaN base layer according to an embodiment of the present invention. Referring to FIG. 2, a highly doped collector contact layer 202 is disposed over the substrate 200 first, then a low doped collector layer 204 is disposed over the collector contact layer 202. The materials of the collector contact layer 202 and the collector layer 204 are both, e.g. GaN or other suitable materials.

Referring to FIG. 2 again, next, a p-type base layer 206 is located over the collector layer 204, and the material of the p-type base layer 206 is, e.g. GaN. After that, a highly doped p-type strained InGaN base layer 208 is located over the p-type base layer 206; the dopant activation concentration of the p-type strained InGaN base layer 208 is, e.g. greater than the dopant activation concentration of the p-type base layer 206; the thickness of the p-type strained InGaN base layer 208 is, e.g. between 1 nm and 55 nm; and the indium molal fraction of the p-type strained InGaN base layer 208 is, e.g. between 0.01 and 0.55.

Referring to FIG. 2, next, an emitter layer 210 is located over the p-type strained InGaN base layer 208, and the material of the emitter layer 210 is, e.g. $Al_xGa_{1-x}N$ ($0 \leq x \leq 1$). Then, a highly doped emitter contact layer 211 is located over the emitter layer 210. In addition, an emitter metal electrode 216 is located on the emitter contact layer 211; a base metal electrode 214 is located on the p-type strained InGaN base layer 208; and a collector metal electrode 212 is located on the collector contact layer 202. The material of the emitter metal electrode 216, the base metal electrode 214, and the collector metal electrode 212 is, e.g. Au, Pt/Ti/Pt/Au, Ti/Al/Ti/Au, Ti/Au, Cr/Au, Pd/Au, Pt/Au, Ni/Au, Ta/Ti, Ti/Pt/Au, or Pt/Ru. In addition, the replaceable materials system for fabricating the GaN heterojunction bipolar transistor is, e.g. AlGaAs/GaAs, InGaP/GaAs, AlInAs/InGaAs/InP, InP/InGaAs, InP/GaAsSb/InP, AlInAs/GaAsSb/InP, Si/SiGe, or GaN/SiC.

It is remarkable that in the structure of this GaN heterojunction bipolar transistor, the workable base includes two areas: the p-type base layer 206 and the p-type strained InGaN base layer 208. Wherein, a two dimensional hole gas (2DHG) is formed between the p-type base layer 206 and the p-type strained InGaN base layer 208, so that the dopant activation concentration of the p-type strained InGaN base layer 208 is above $10^{19} cm^{-3}$. The base contact resistance is decreased when the base metal electrode 214 is disposed on the p-type strained InGaN base layer 208, so that ohmic contact can be formed at the base of the GaN heterojunction bipolar transistor easily. In addition, since the p-type strained InGaN base layer 208 is located between the p-type base layer 206 and the emitter layer 210, the emitter-base equivalent conduction band ($\Delta E_c$) of the transistor as well as the threshold voltage of the transistor will be reduced when the transistor is under the forward bias of the emitter-base voltage $V_{BE}$.

Figure 3:
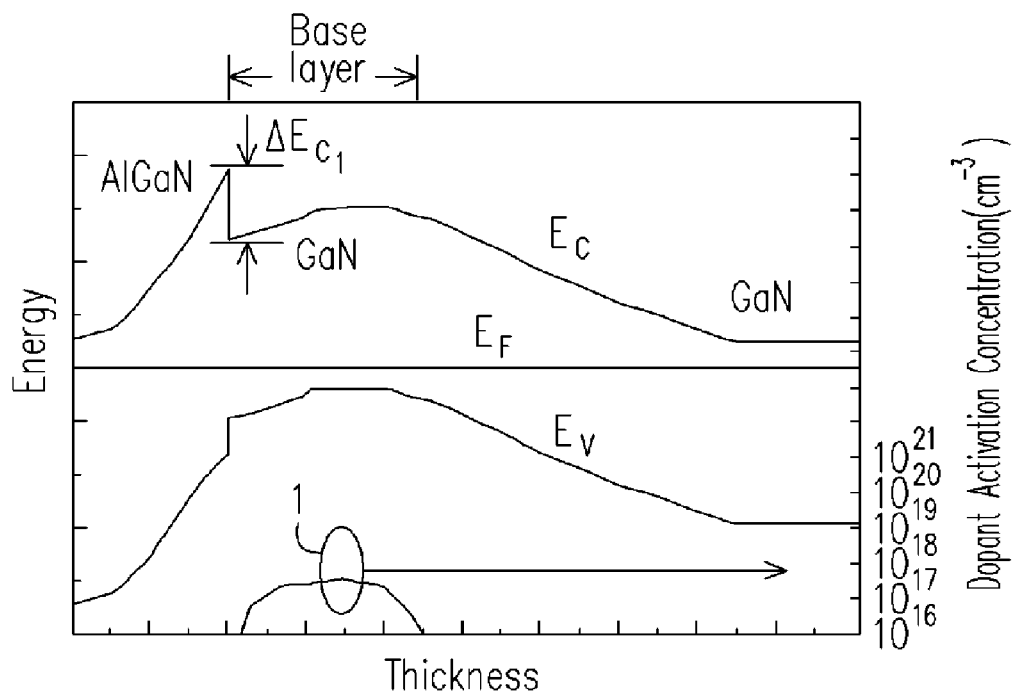
FIG. 3 is a diagram illustrating the relations among the film thickness, energy, and dopant activation concentration of a conventional GaN heterojunction bipolar transistor.
Figure 4:
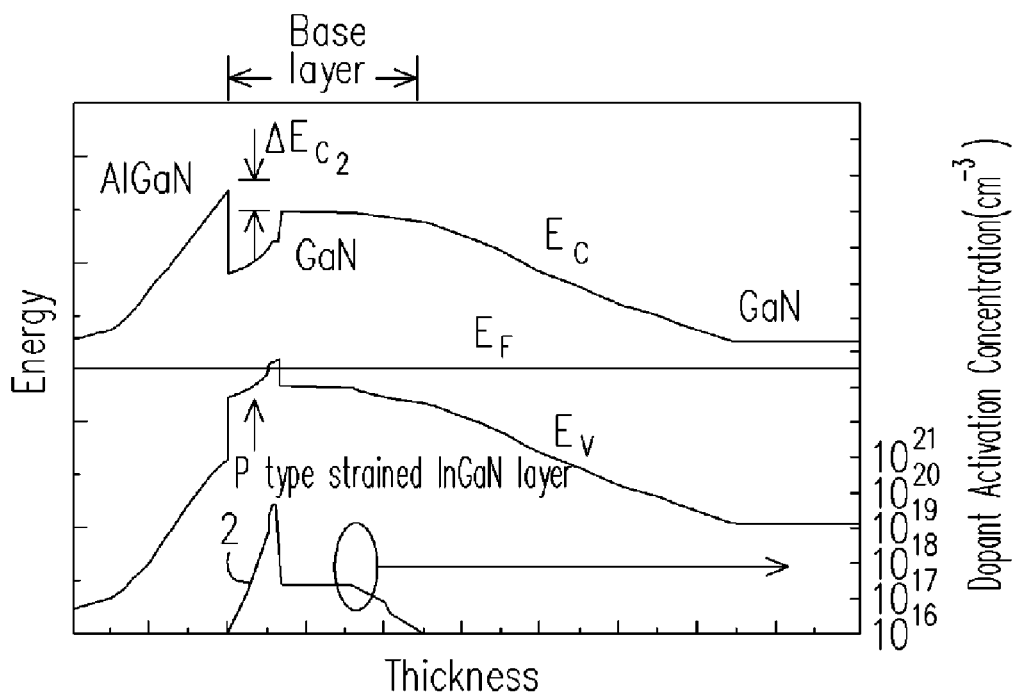
FIG. 4 is a diagram illustrating the relations among the film thickness, energy, and dopant activation concentration of a GaN heterojunction bipolar transistor in the present invention.

Here, the embodiment of the present invention in FIG. 4 will be described with reference to the conventional example in FIG. 3. FIG. 3 is a diagram illustrating the relation between the film thickness and the energy bands of a conventional GaN heterojunction bipolar transistor, and curve 1 as shown in FIG. 3 represents the relation between the film thickness and the dopant activation concentration thereof. FIG. 4 is a diagram illustrating the relation between the film thickness and the energy bands of a GaN heterojunction bipolar transistor in the present invention, and curve 2 as shown in FIG. 4 represents the relation between the film thickness and the dopant activation concentration thereof. It can be understood by comparing FIG. 3 and FIG. 4 that the difference ($\Delta E_{c1}$) between the emitter and the base in a conventional equivalent conduction band is greater than the difference ($\Delta E_{c2}$) between the emitter and the base in the equivalent conduction band of the present invention because of the additional p-type strained InGaN base layer in the present invention. In addition, it can be understood from curves 1 and 2 in the figures that the dopant activation concentration of the p-type strained InGaN base layer 208 in the present invention can reach above $10^{19} cm^{-3}$ due to the formation of the 2DHG, while the dopant activation concentration of the conventional base layer is about $10^{17} cm^{-3}$.

FIGS. 5A~5D are cross-sectional diagrams illustrating the fabrication flow of a GaN heterojunction bipolar transistor with a p-type strained InGaN base layer according to an embodiment of the present invention.

Figure 5A:
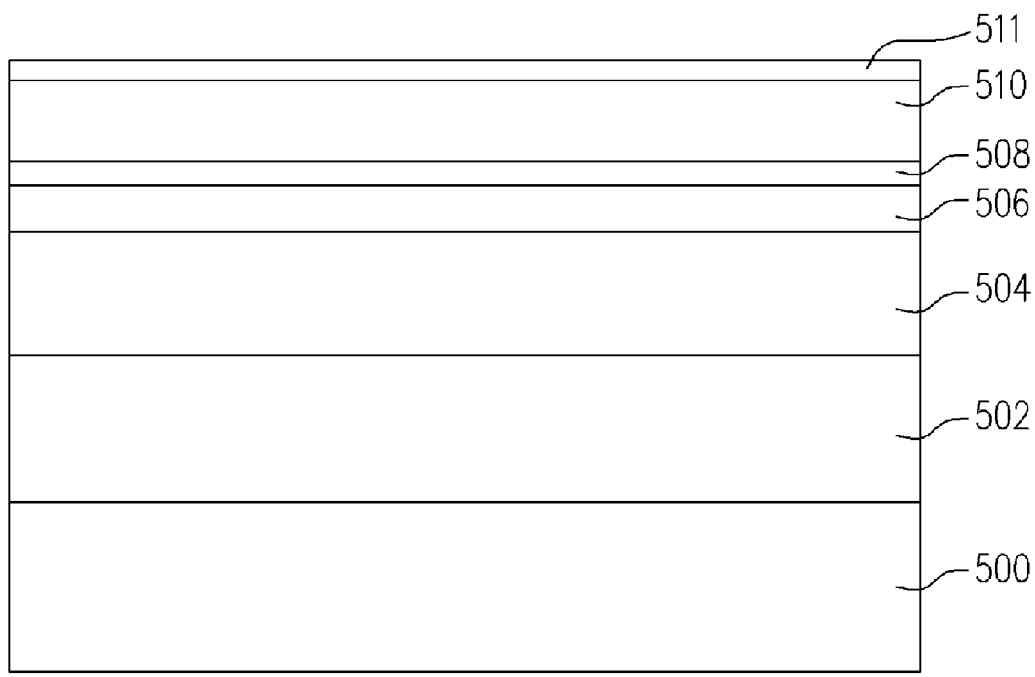
FIGS. 5A~5D are cross-sectional diagrams illustrating the fabrication flow of a GaN heterojunction bipolar transistor according to an embodiment of the present invention.

First, referring to FIG. 5A, the substrate 500 is provided, and the collector contact layer 502, the low doped collector layer 504, the p-type base layer 506, the p-type strained InGaN base layer 508, the emitter layer 510, and the highly doped emitter contact layer 511 are formed in sequence on the substrate 500. The method of forming the collector contact layer 502, the collector layer 504, the p-type base layer 506, the p-type strained InGaN base layer 508, the emitter layer 510, and the emitter contact layer 511 is, e.g. Molecular Beam Epitaxy or Metalorganic Chemical Vapor Deposition (MOCVD). In addition, the replaceable materials system of the heterojunction bipolar transistor is, e.g. AlGaAs/GaAs, InGaP/GaAs, AlInAs/InGaAs/InP, InP/InGaAs, InP/GaAsSb/InP, AlInAs/GaAsSb/InP, Si/SiGe, or GaN/SiC.

Figure 5B:
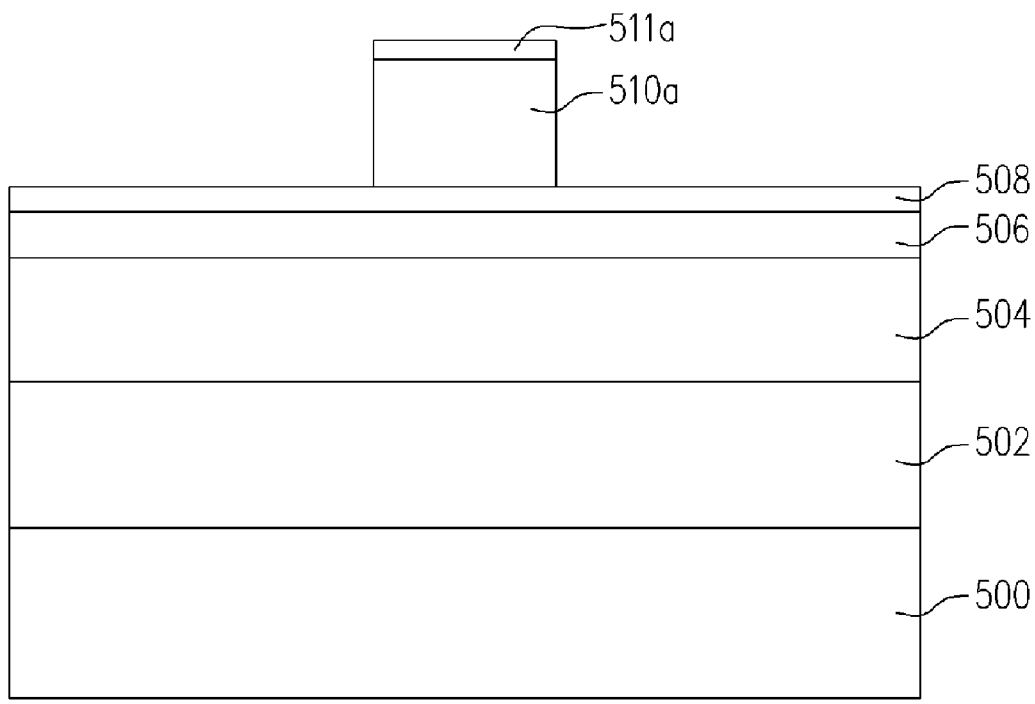

Next, referring to FIG. 5B, portions of the emitter layer 510 and the emitter contact layer 511 are removed to expose the p-type strained InGaN base layer 508, so as to form an emitter layer 510a and an emitter contact layer 511a. The method of removing portions of the emitter layer 510 and the emitter contact layer 511 is, e.g. through etching process, and the etching process is, e.g. dry etching, or wet etching.

Figure 5C:
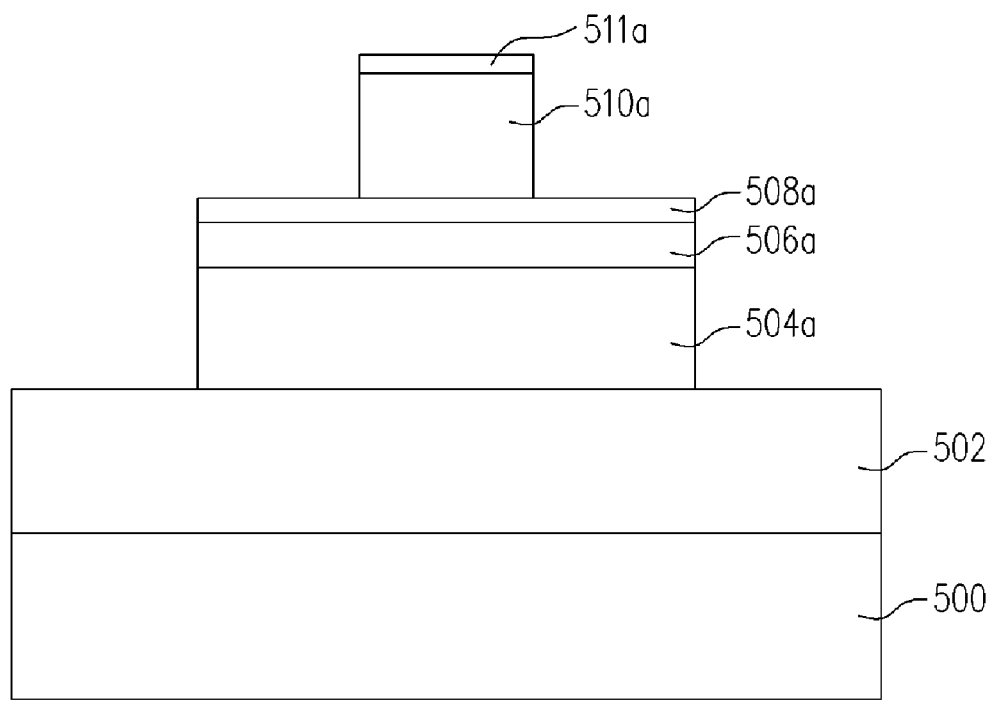

Then, referring to FIG. 5C, portions of the p-type strained InGaN base layer 508, the p-type base layer 506, and the collector layer 504 are removed to expose the collector contact layer 502, so as to form a p-type strained InGaN base layer 508a, a p-type base layer 506a, and a collector layer 504a. The method of removing portions of the p-type strained InGaN base layer 508, the p-type base layer 506, and the collector layer 504 is, e.g. through etching process, and the etching process is, e.g. dry etching, or wet etching.

Figure 5D:
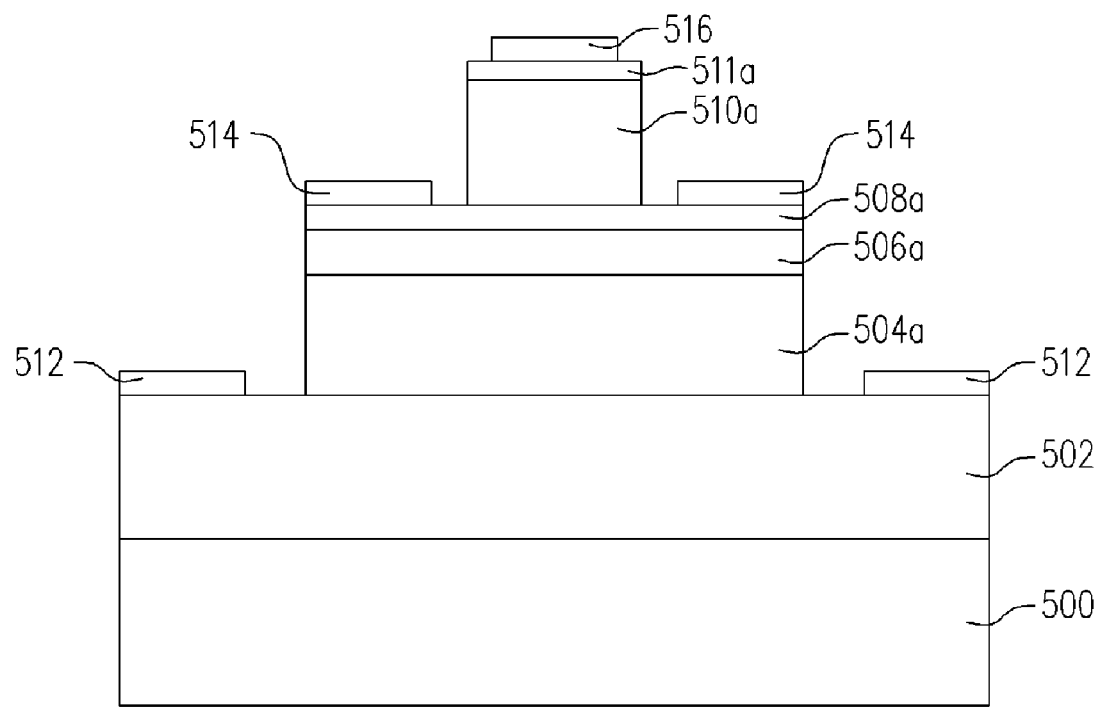

After that, referring to FIG. 5D, an emitter metal electrode 516, a base metal electrode 514, and a collector metal electrode 512 are respectively formed on the exposed emitter contact layer 511a, the exposed p-type strained InGaN base layer 508a, and the exposed collector contact layer 502. Wherein, the material of the emitter metal electrode 516, the base metal electrode 514, and the collector metal electrode 512 is, e.g. Au, Pt/Ti/Pt/Au, Ti/Al/Ti/Au, Ti/Au, Cr/Au, Pd/Au, Pt/Au, Ni/Au, Ta/Ti, Ti/Pt/Au, or Pt/Ru.

FIGS. 6A~6D are cross-sectional diagrams illustrating the fabrication flow of a GaN heterojunction bipolar transistor with a p-type strained InGaN base layer according to another embodiment of the present invention.

Figure 6A:
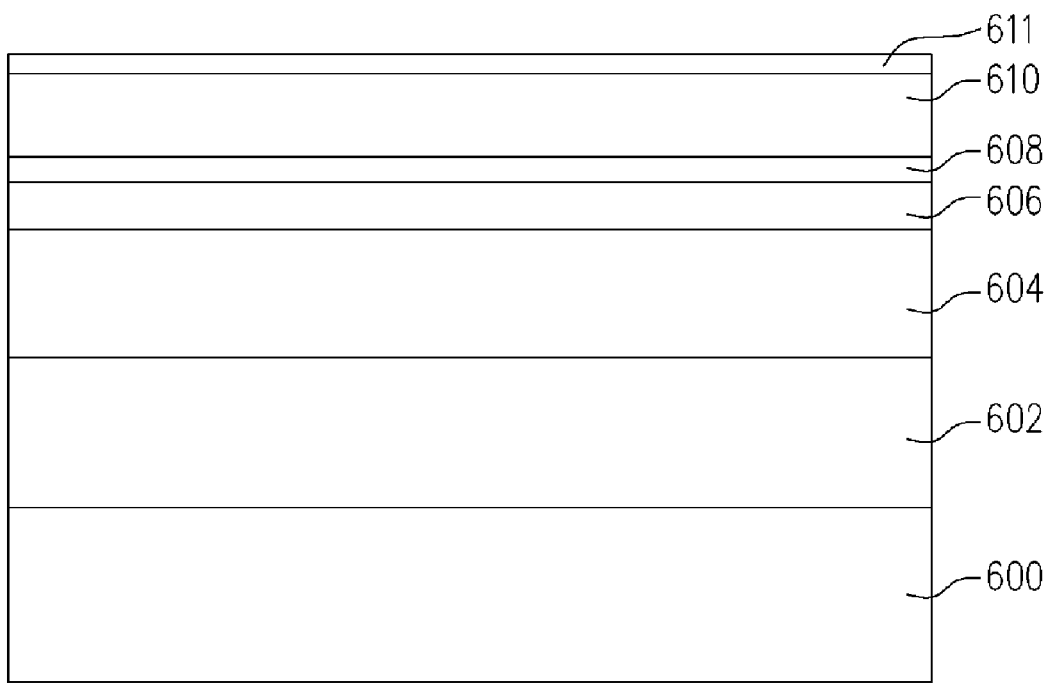
FIGS. 6A~6D are cross-sectional diagrams illustrating the fabrication flow of a GaN heterojunction bipolar transistor according to another embodiment of the present invention.

First, referring to FIG. 6A, the substrate 600 is provided, and a collector contact layer 602, a low doped collector layer 604, a p-type base layer 606, a p-type strained InGaN base layer 608, an emitter layer 610, and a highly doped emitter contact layer 611 are formed in sequence on the substrate 600. The method of forming the collector contact layer 602, the collector layer 604, the p-type base layer 606, the p-type strained InGaN base layer 608, the emitter layer 610, and the emitter contact layer 611 is, e.g. Molecular Beam Epitaxy or Metalorganic Chemical Vapor Deposition (MOCVD). In addition, the replaceable materials system of the heterojunction bipolar transistor is, e.g. AlGaAs/GaAs, InGaP/GaAs, AlInAs/InGaAs/InP, InP/InGaAs, InP/GaAsSb/InP, AlInAs/GaAsSb/InP, Si/SiGe, or GaN/SiC.

Figure 6B:
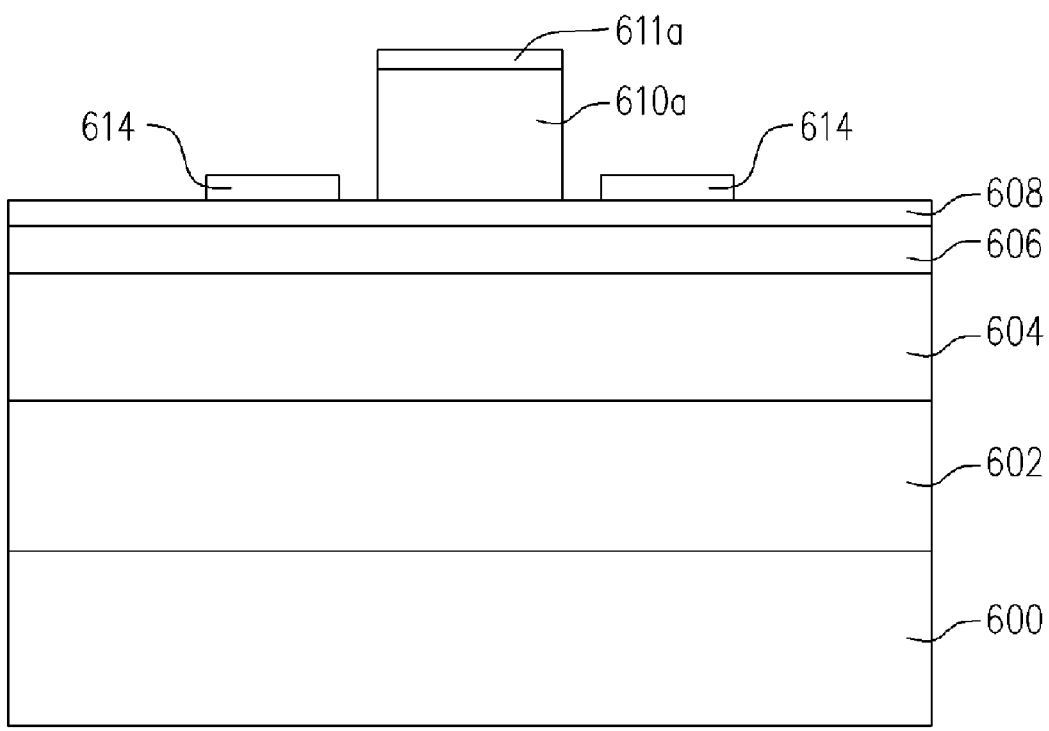

Next, referring to FIG. 6B, portions of the emitter layer 610 and the emitter contact layer 611 are removed to expose the p-type strained InGaN base layer 608, so as to form an emitter layer 610a and an emitter contact layer 611a. The method of removing portions of the emitter layer 610 and the emitter contact layer 611 is, e.g. through etching process, and the etching process is, e.g. dry etching, or wet etching. After that, a base metal electrode 614 is formed on the exposed p-type strained InGaN base layer 608. The material of the base metal electrode 614 is, e.g. Au, Pt/Ti/Pt/Au, Ti/Al/Ti/Au, Ti/Au, Cr/Au, Pd/Au, Pt/Au, Ni/Au, Ta/Ti, Ti/Pt/Au, or Pt/Ru.

Figure 6C:
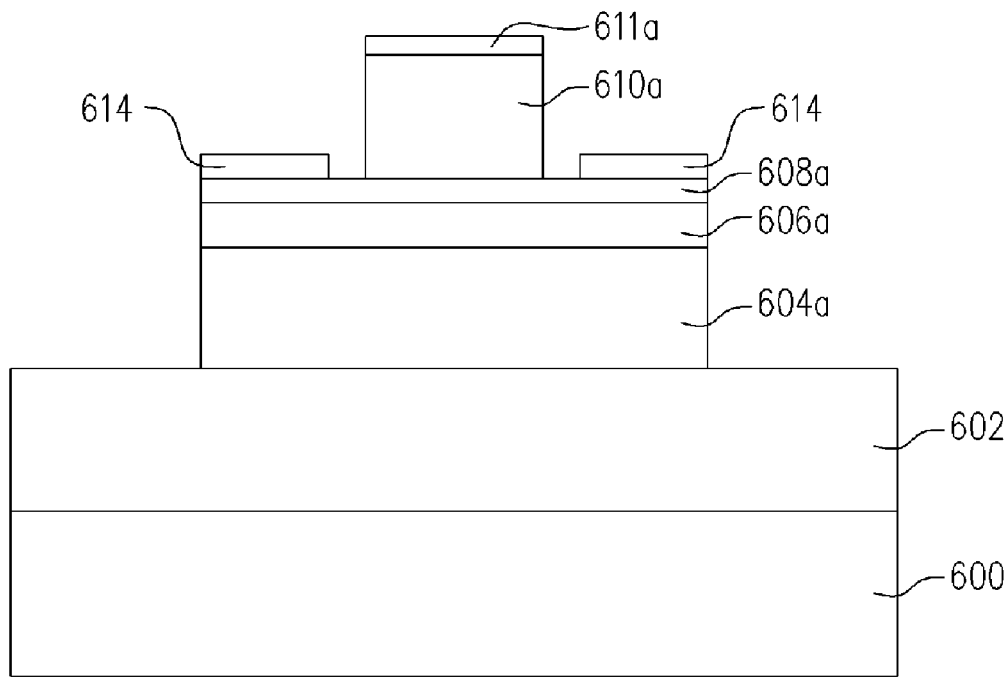

Then, referring to FIG. 6C, portions of the p-type strained InGaN base layer 608, the p-type base layer 606, and the collector layer 604 are removed until a portion of the collector contact layer 602 is exposed, so as to form a p-type strained InGaN base layer 608a, a p-type base layer 606a, and a collector layer 604a. The method of removing portions of the p-type strained InGaN base layer 608, the p-type base layer 606, and the collector layer 604 is, e.g. through etching process, and the etching process is, e.g. dry etching, or wet etching.

Figure 6D:
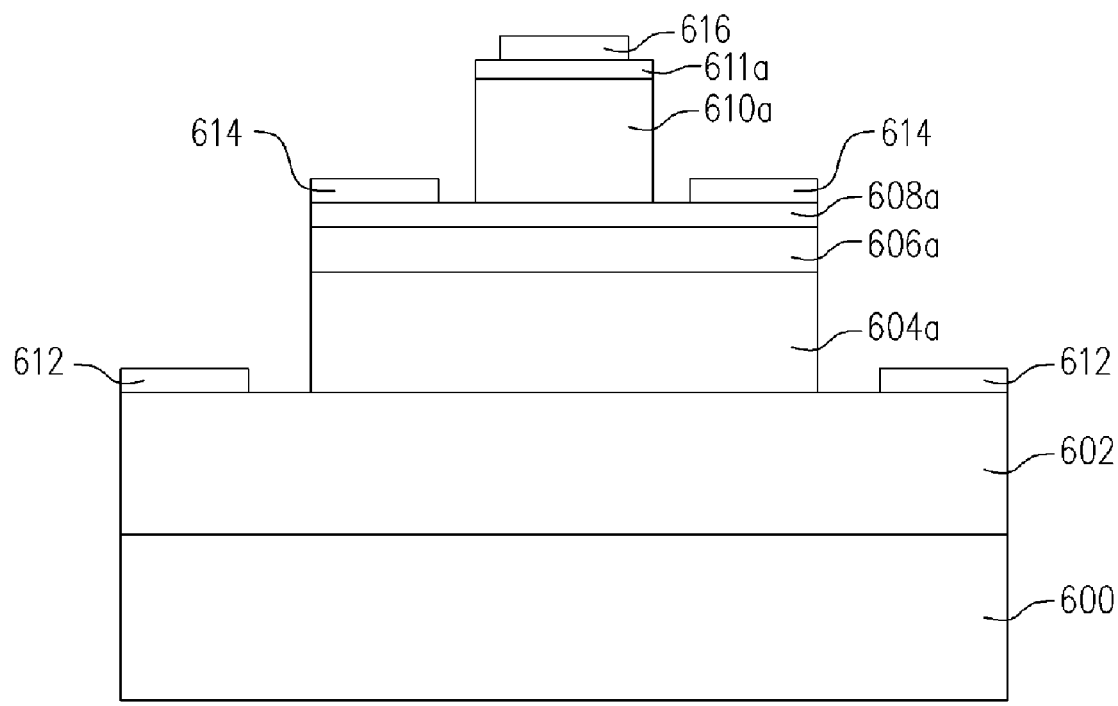

After that, referring to FIG. 6D, an emitter metal electrode 616 is formed on the exposed emitter contact layer 610a, and a collector metal electrode 612 is formed on the exposed collector contact layer 602. The material of the emitter metal electrode 616 and the collector metal electrode 612 is, e.g. Au, Pt/Ti/Pt/Au, Ti/Al/Ti/Au, Ti/Au, Cr/Au, Pd/Au, Pt/Au, Ni/Au, Ta/Ti, Ti/Pt/Au, or Pt/Ru.

In overview, the GaN heterojunction bipolar transistor of the present invention has at least the following advantages:

1. A p-type strained InGaN base layer is added between the p-type base layer and the emitter layer, so that a 2DHG is formed between the p-type base layer and the p-type strained InGaN base layer.

2. The dopant activation concentration of the p-type strained InGaN base layer is above $10^{19} cm^{-3}$. Thus, the base contact resistance is reduced, and accordingly ohmic contact is achieved at the base of the GaN heterojunction bipolar transistor.

3. Because the p-type strained InGaN base layer is located between the p-type base layer and the emitter layer, the equivalent conduction band ($\Delta_{Ec}$) difference between the emitter and the base is reduced when the transistor is under the emitter-base forward bias. Accordingly, the threshold voltage of the transistor will also be reduced.

Because of the foregoing advantages, the device characteristics can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A GaN heterojunction bipolar transistor with a p-type strained InGaN base layer, comprising:

a substrate;

a highly doped collector contact layer, located over the substrate;

a low doped collector layer, located over the collector contact layer;

a p-type base layer, located over the collector layer;

a highly doped p-type strained InGaN base layer, located directly on a top surface of the p-type base layer and covering the whole top surface of the p-type base layer;

an emitter layer, located over the highly doped p-type strained InGaN base layer;

a highly doped emitter contact layer, located over the emitter layer; and an emitter metal electrode, a base metal electrode, a collector metal electrode, respectively located on the emitter contact layer, the p-type strained InGaN base layer and the collector contact layer.

2. The GaN heterojunction bipolar transistor as claimed in claim 1, wherein the material of the p-type base layer comprises GaN.

3. The GaN heterojunction bipolar transistor as claimed in claim 1, wherein the material of the emitter layer comprises $Al_xGa_{1-x}N$ ($0 \leq x \leq 1$).

4. The GaN heterojunction bipolar transistor as claimed in claim 1, wherein the material of the collector contact layer and the collector layer comprises GaN.

5. The GaN heterojunction bipolar transistor as claimed in claim 1, wherein the dopant activation concentration of the p-type strained InGaN base layer is greater than the dopant activation concentration of the p-type base layer.

6. The GaN heterojunction bipolar transistor as claimed in claim 1, wherein the thickness of the p-type strained InGaN base layer is between 1 nm and 55 nm.

7. The GaN heterojunction bipolar transistor as claimed in claim 1, wherein the indium molar fraction of the p-type strained InGaN base layer is between 0.01 and 0.55.

8. The GaN heterojunction bipolar transistor as claimed in claim 1, wherein the material of the emitter metal electrode, the base metal electrode, and the collector metal electrode includes Au, Pt/Ti/Pt/Au, Ti/Al/Ti/Au, Ti/Au, Cr/Au, Pd/Au, Pt/Au, Ni/Au, Ta/Ti, Ti/Pt/Au, or Pt/Ru.

* * * * *